United States Patent [19]
LaRosa et al.

[11] Patent Number: 5,299,232
[45] Date of Patent: Mar. 29, 1994

[54] PHASE COMPENSATION METHOD AND APPARATUS

[75] Inventors: Christopher P. LaRosa, Lake Zurich; Michael J. Carney, Palatine, both of Ill.

[73] Assignee: Motorola, Inc., Schaumburg, Ill.

[21] Appl. No.: 858,245

[22] Filed: Mar. 26, 1992

[51] Int. Cl.$^5$ .............. H03D 1/04; H03D 1/06; H03K 5/01; H03K 6/04

[52] U.S. Cl. ................... 375/99; 375/118; 328/155

[58] Field of Search ............... 375/99, 118, 102; 328/109, 155

[56] References Cited

U.S. PATENT DOCUMENTS

| | | | |
|---|---|---|---|
| 4,788,696 | 11/1988 | Sakane et al. | 375/111 |
| 4,797,730 | 1/1989 | Smith | 358/19 |
| 4,803,385 | 2/1989 | Nawata | 328/109 X |
| 5,128,968 | 7/1992 | Yoshida | 328/155 X |

Primary Examiner—Stephen Chin
Assistant Examiner—Bryan E. Webster
Attorney, Agent, or Firm—Kirk W. Dailey; Rolland R. Hackbart; F. John Motsinger

[57] ABSTRACT

A method of and apparatus for compensating a received signal's phase compensates for the distortion caused by the asymmetrical characteristics of a voltage limiter. This compensation allows the received signal to be sampled at the positive and negative zero-crossings reducing the requirements of a local oscillator in a radiotelephone system. First, the phase of the received signal is sampled at the positive and negative zero-crossings, forming a corresponding positive-crossing and a negative-crossing phase value for the received signal. Second, the negative-crossing and positive-crossing phase values are combined, forming a first difference signal. Third, an estimated error signal is formed using the first difference signal. Fourth, the estimated error signal is combined with the positive or negative zero-crossing phase signals, substantially eliminating the asymmetrical distortion.

38 Claims, 3 Drawing Sheets

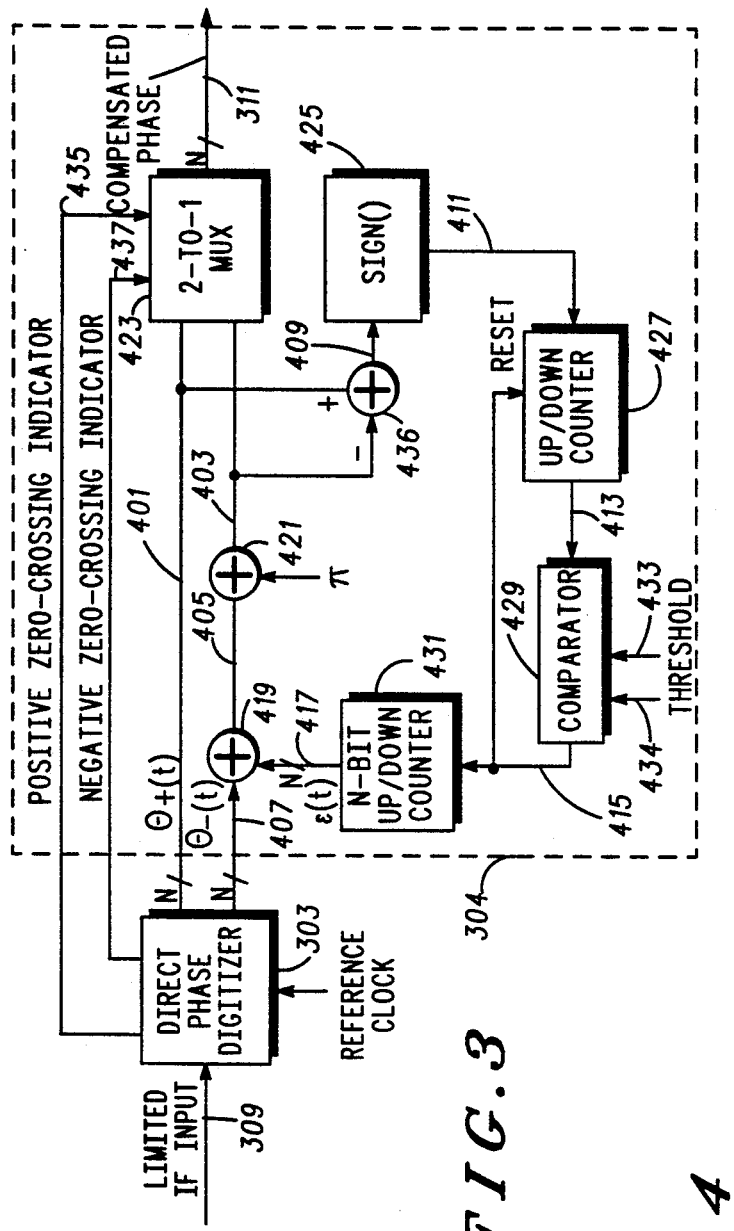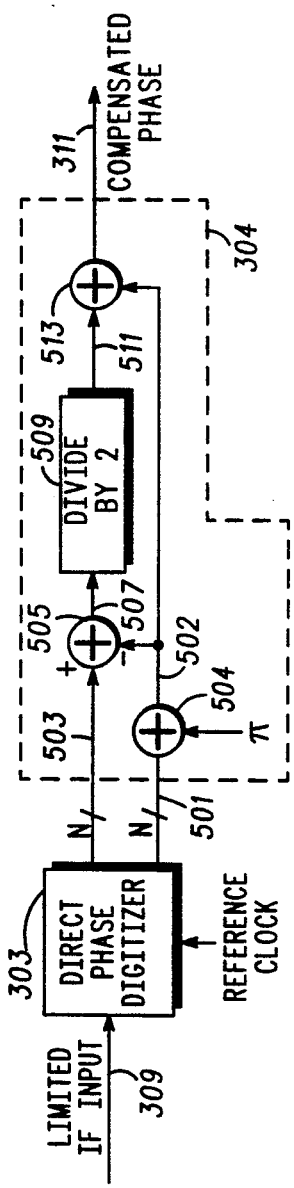
*FIG. 3*
*FIG. 4*

PHASE COMPENSATION METHOD AND APPARATUS

FIELD OF THE INVENTION

This invention generally relates to radio receivers and more specifically to phase compensation in a demodulator using a non-ideal voltage limiter.

BACKGROUND OF THE INVENTION

In a conventional radio system utilizing a digital or analog phase modulation scheme, the phase of the received signal can be extracted using zero-crossing information. Specifically, the received signal at an intermediate frequency (IF) is applied as an input to a voltage limiter. Next, the system transforms the output of the voltage limiter into digitally encoded phase information. One way to digitize the limited received signal is to sample the signal at the zero-crossing levels. Typically, the system samples the voltage limited received signal at either the positive or the negative zero-crossings levels. FIG. 6 illustrates a received signal 701 and a voltage limited signal 705. A voltage limiter has an internal voltage threshold $V_t$ 703. The output signal of the voltage limiter is specified by the following input-output characteristic $$V_{out} = \begin{matrix} V_h \text{ if } V_{in} > V_t \\ \\ V_L \text{ if } V_{in} < V_t \end{matrix}$$

where $V_h$ and $V_L$ are the high and low logic levels, respectively. For an ideal limiter Vt is equal to zero. However, ideal voltage limiters are difficult to manufacture in large volumes due to differences in make tolerance and the variation of the part over temperature. When the voltage threshold $V_t$ is not equal to zero, the positive and negative zero-crossings will not be exactly 180 degrees out of phase, and the limiter output signal becomes asymmetric. The asymmetry causes a discrepancy in the phase at the positive zero-crossings relative to the phase at the negative zero-crossings. As illustrated in FIG. 6, the time T1 707 is less than time T2 709. In a system using positive and negative zero-crossings to sample the phase of the received signal, the difference in time results in distorted phase information. Most conventional systems resolve this problem by sampling only at the positive zero-crossings of the voltage limited signal. However, it is a desirable feature of a phase demodulating system to be able to sample at both the positive and negative zero-crossings. By doing so, the phase quantization portion of the system can operate at one-half the frequency typically required to extract phase information.

To quantify the discrepancy in phases at the positive and negative zero-crossings, the received intermediate frequency signal can be represented as $$s(t) = A(t)\sin[2\pi f_i t + \theta(t)]$$

where $\theta(t)$ is the phase modulation to be recovered. At the IF zero-crossings s(t) will be zero, and the phase signal $\theta(t)$ can be represented as $$\theta_+(t) = [-2\pi f_i t_k + \text{asin}(V_t/A(t))]_{mod} 2\pi \text{ at positive zero-crossings}$$

$$\theta_-(t) = [-2\pi f_i t_k + \pi - \text{asin}(V_t/A(t))]_{mod} 2\pi \text{ at negative zero-crossings.}$$

When the phase modulation is constant, $\theta_+(t)$ and $\theta_-(t)$ should differ by exactly $\pi$ radians; however, a non-zero limiter threshold $V_t$ results in an average phase error term equal to $$\epsilon = E\{\theta_+(t) - \theta_-(t) + \pi\} = 2\text{asin}[V_t/A(t)]$$

To compensate for the deleterious effects of asymmetric limiting, this phase error term must be removed.

The implementation of phase demodulator systems which sample at both positive and negative zero-crossings allows a reduction of the intermediate and reference oscillator frequencies by one-half. The result is a decrease in current drain, which translates into extended battery life in a portable product. Therefore, it would be advantageous to develop a method of digitally compensating for voltage limiter asymmetries.

SUMMARY OF THE INVENTION

The present invention encompasses a method of compensating for distortion of the phase of a received signal, allowing sampling of the phase at both the positive and negative zero-crossings. The distortion is caused by the asymmetrical characteristics of a voltage limiter. First, the phase of the received signal is sampled at the positive and negative zero-crossings, forming a corresponding positive-crossing and a negative-crossing phase value for the received signal. Second, the negative-crossing and positive-crossing phase values are combined, forming a first difference signal. Third, an estimated error signal is formed using the first difference signal. Fourth, the estimated error signal is combined with the positive or negative zero-crossing phase signals, substantially eliminating the asymmetrical distortion.

BRIEF DESCRIPTION OF THE DRAWINGS

FIG. 3 is a block diagram of a phase compensation circuit in accordance with the present invention.

FIG. 4 is an alternative embodiment of the phase compensation unit in accordance with the present invention.

DESCRIPTION OF A PREFERRED EMBODIMENT

The preferred embodiment encompasses a phase compensation circuit which corrects for the asymmetry caused by a non-ideal voltage limiter. This phase compensation circuit allows a phase demodulating system to sample the phase at both the positive and negative zero-crossings of a received data signal, reducing the required frequency of the reference oscillator by a factor of two. The result is a significant reduction in the power consumption of a radio receiver.

Figure 1:
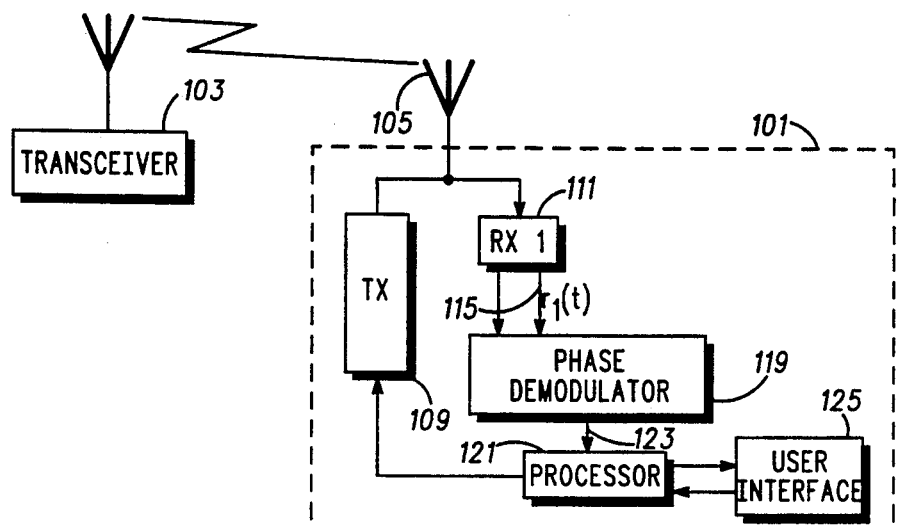
FIG. 1 is a block diagram of a radiotelephone system in accordance with the present invention.

FIG. 1 is a block diagram of a radiotelephone system which may employ the present invention. In the radiotelephone system, the fixed site transceiver 103 sends and receives radio frequency (RF) signals to and from mobile and portable radiotelephones contained within a fixed geographic area served by the fixed site transceiver 103. The radiotelephone 101 is one such radiotelephone served by the fixed site transceiver 103.

While receiving signals from the fixed site transceiver 103, the radiotelephone 101 uses the antenna 105 to couple the RF signal and convert the RF signal into an electrical RF signal. The radio receiver 111 receives the electrical RF signal, for use within the radiotelephone 101. The receiver 111 generates the intermediate frequency (IF) signal 115. This signal is input into the phase demodulator 119. The phase demodulator 119 outputs a symbol signal 123 for use by the processor 121. Processor 121 formats the symbol signal 123 into voice or data for the user interface 125. The user interface 125 contains a microphone, a speaker and a keypad.

Upon the transmission of RF signals from the portable radiotelephone 101 to the fixed site transceiver 103, the processor 121 formats the voice and/or data signals from the user interface. The formatted signals are input into the transmitter 109. The transmitter 109 converts the data into electrical RF signals. The antenna 105 receives the electrical RF signals and outputs these signals as RF signals. The fixed site transceiver 103 receives the RF signals.

Figure 2:
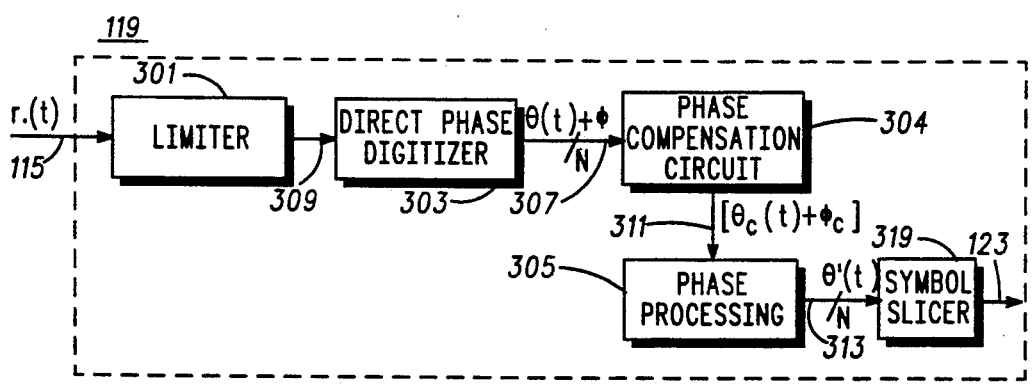
FIG. 2 is a block diagram of a phase demodulator in accordance with the present invention.

FIG. 2 is a block diagram of the phase demodulator 119 as illustrated in FIG. 1. The phase demodulator 119 includes the limiter 301, the direct phase digitizer 303, the phase compensation circuit 304, the phase processing circuit 305, and the symbol slicer 319. The limiter 301 receives the IF signal 115 and limits the voltage of the IF signal 115 to two voltage levels corresponding to a logic level 0 and a logic level 1. The limiter 301 outputs a limited received signal 309. The direct phase digitizer 303 uses both the negative and positive zero-crossings of the limited received signal 309 to quantize the phase of the received waveform into the N-bit digitized phase signal 307 ($\theta(t)+\phi$). The digitized phase signal 307 is applied as an input to the phase compensation circuit 304. The phase compensation circuit 304 digitally compensates for asymmetrics caused by the limiter 301 to produce the compensated phase signal [$\theta c(t)+\phi_c$] 311. The phase processing unit 305 receives the compensated phase signal 311. The phase processing unit 305 removes the constant phase offset ($\phi_c$). The phase processing unit 305 may contain either a coherent phase processor or a differentially coherent phase processor. The preferred embodiment employs a differentially coherent phase processor to remove the constant phase offset ($\phi_c$). The resulting digital phase signal ($\theta'(t)$) 313 is input to the symbol slicer 319. The symbol slicer 319 outputs the symbol decisions 123 which correspond to the detected phase signal 313.

FIG. 3 is a detailed block diagram of the phase compensation circuit 304 as illustrated in FIG. 2. This phase compensation circuit estimates the phase error $\epsilon(t)$ and then adds this term to the negative zero-crossing phase values. An equally sufficient system may be developed which would add an estimated error to the positive zero-crossing phase values without affecting performance. This alternative embodiment remains within the scope of the disclosed invention.

The output of the direct phase digitizer 303 includes two N-bit signals. The first output signal ($\theta_+(t)$) 401 contains the phase values sampled at the positive zero-crossings of the received signal. The second output signal ($\Theta_-(t)$) 407 contains the corresponding phase values from the negative zero-crossings of the received signal. First, the combiner 421 shifts $\theta_-(t)$ 407 by $\pi$ radians, producing the phase-shifted signal ($\theta_-(t)+\pi$) 403. This phase shifting, which is required because positive and negative zero-crossing information differs in phase by 180 degrees, brings $\theta_-(t)$ 407 into the same quadrant as $\theta_+(t)$ 401. Next, the combiner 436 subtracts the phase shifted signal ($\theta_-(t)+\pi$) 403 from $\theta_+(t)$, forming a phase difference signal 409. The sign extraction unit 425 determines the sign of the difference signal 409. The sign signal 411 is input into an up/down counter 427. In the preferred embodiment at initialization, the up/down counter 427 is preset to a value of zero. If the phase signal $\theta_+(t)$ 401 is greater than the phase shifted signal ($\theta_-(t)+\pi$) 403, then the sign signal 411 causes the counter 427 to be incremented. On the other hand, if the phase signal $\theta_+(t)$ 401 is less than the phase shifted signal ($\theta_-(t)+\pi$) 403, the sign signal 411 causes the counter 427 to be decremented.

The output signal 413 of the up/down counter 427 is equal to the current value of the counter 427. The comparator 429 compares the up/down counter output signal 413 to a positive threshold 434 and also a negative threshold 433. Adjusting the thresholds of the comparator 429 changes the effective bandwidth of the compensation circuit. Increasing the magnitudes of the threshold values 433 and 434 reduces the bandwidth of the compensation circuit. As a result, the circuit responds more slowly to instantaneous phase errors. Conversely, smaller threshold values correspond to an increase in the bandwidth of the compensation circuit.

If the value of counter output signal 413 is greater than the positive threshold 434, then the comparator output signal 415 causes the N-bit up/down counter 431 to be incremented. If, on the other hand, the value of the counter output signal 413 is less than the negative threshold 433, then the comparator output signal 415 causes the N-bit up/down counter 431 to be decremented. In the preferred embodiment, the initial value of the up/down counter 431 is zero. The N-bit up/down counter output signal 417 is the estimated error signal, which is equal to the current value of the up/down counter 431. The estimated error signal 417 is combined with $\theta_-(t)$ 407 resulting in a corrected phase value signal 405. The corrected phase shifted signal 403 and $\theta_+(t)$ 401 are combined in the 2-to-1 multiplexer 423. The positive zero-crossing indicator 435 from the direct phase digitizer 303 is used to select the phase signal $\theta_+(t)$ 401; the negative zero-crossing indicator is used to select the corrected, phase shifted signal 403. This results in the digitally compensated phase signal 311. Thus, this processing circuitry 304 effectively removes the phase error $\epsilon(t)$ caused by the asymmetric qualities of the voltage limiter 301.

FIG. 4 is an alternative embodiment of the phase compensation circuitry 304. This technique cancels the error signal $\epsilon(t)$ and is somewhat simpler to implement than the method illustrated in FIG. 3. The circuit produces the modulo-$2\pi$ average of the two signals 502, 503 to compensate for the limiter's asymmetric qualities. First, the combiner 504 shifts $\theta-(t)$ 501 by $\pi$ radians, producing the phase-shifted signal ($\theta-(t)+\pi$) 502. This phase-shifting operation is required because positive and negative zero-crossing phase values differ by 180 degrees. The phase compensation circuit 304 then subtracts signal 502 from $\theta_+(t)$ 503 at combiner 505. Next, the resulting signal 507 is divided by 2 at divider 509.

Finally, signal 502 is added to the resulting signal 511 to produce the digitally compensated phase signal 311.

Figure 5:
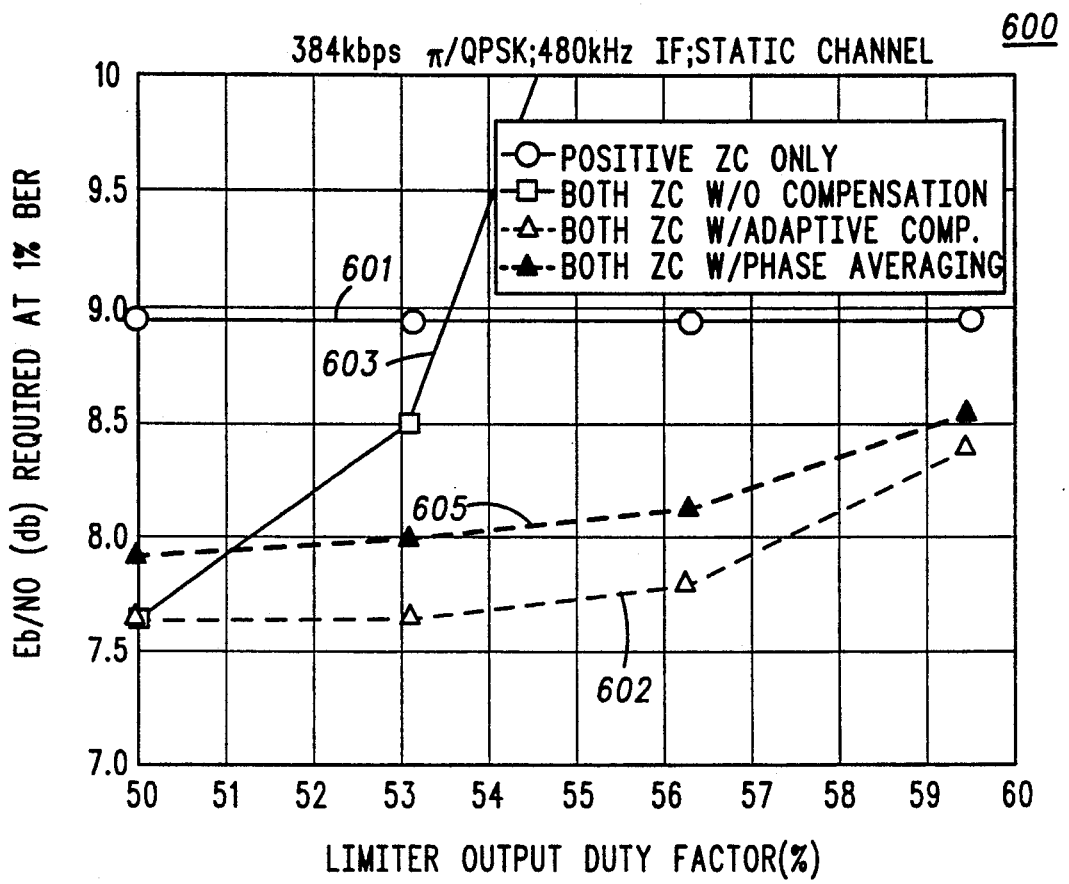
FIG. 5 is a graph illustrating the performance of the system employing the present invention.
Figure 6:
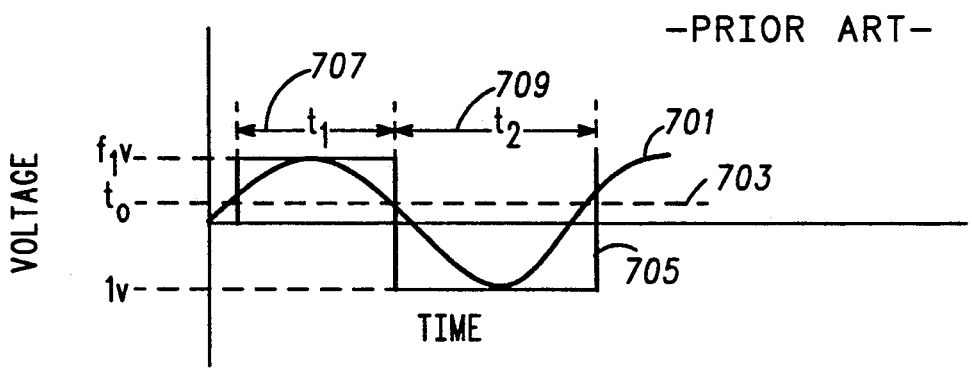
FIG. 6 is a graph of a received signal and the output of a non-ideal voltage limiter.

Bit error rate (BER) simulations have been completed to evaluate the performance of the two proposed limiter compensation techniques discussed herein and illustrated in FIG. 3 and FIG. 4. The system utilizes 384 Kbps $\pi/4$ QPSK modulation at an intermediate frequency of 480 Khz. The results, which are represented in FIG. 5, plot the Eb/No required at a 1% BER as a function of limiter symmetry for four different detector structures. First, curve 601 corresponds to a detector using only positive zero-crossings. A second curve 603 corresponds to a detector using both zero-crossings without the limiter compensation disclosed herein. A third curve 605 corresponds to a detector using both zero-crossings with the adaptive limiter compensation loop illustrated in FIG. 3. A fourth curve 605 corresponds to a detector using both zero-crossings with the phase averaging circuit illustrated in FIG. 4. For the results of FIG. 5, a limiter output duty factor defines the limiter asymmetry. A 50% duty factor corresponds to an ideal voltage limiter.

As the simulation results demonstrate, a detector with a limiter having a 50% duty factor provides improved time resolution when both zero-crossings are used. The detector using both zero-crossings exhibited 1.25 dB of BER improvement over a single zero-crossing detector. However, without compensation the performance of the detector using both zero-crossings will degrade quite rapidly with increasing limiter asymmetry. Both limiter compensation techniques are highly effective in alleviating this problem. FIG. 5 shows the adaptive limiter compensation loop performing about 0.25 dB better than the phase averaging circuit at 1% BER. However, improvements in the performance of the phase averaging method are realized by increasing the precision of the averaging circuitry. With this improved precision, the performance of the phase averaging method is nearly identical to that of the adaptive loop illustrated by curve 602 of FIG. 5.

What is claimed is:

1. A method of phase compensation of a received signal, the received signal having positive and negative zero-crossings and a phase, the received signal input into a voltage limiter causing asymmetrical distortion of the positive and negative zero-crossings of the received signal, the method comprising the steps of:
   sampling the phase of the received signal at the positive and negative zero-crossings, forming a corresponding positive-crossing and a negative-crossing phase value;
   combining said negative-crossing phase value and said positive-crossing phase value, forming a first difference signal having a magnitude and a sign selected from the group consisting of a positive sign and a negative sign;
   forming an estimated error signal responsive to the sign of said first difference signal; and
   combining said estimated error signal with said sampled phase selected from the group consisting of said negative zero-crossings and said positive zero-crossings, substantially eliminating said asymmetrical distortion.

2. A method of phase compensation in accordance with claim 1 wherein said step of forming an estimated error signal comprises the steps of:
   incrementing, responsive to a positive sign of said first difference signal, a first value of a first counter;
   comparing said first value to a first positive threshold value; and
   generating, responsive to said step of comparing, an estimated error signal.

3. A method of phase compensation in accordance with claim 1 wherein said step of forming an estimated error signal comprises the steps of:
   decrementing, responsive to a negative sign of said first difference signal, a first value of a first counter;
   comparing said first value to a first negative threshold value; and
   generating, responsive to said step of comparing, an estimated error signal.

4. A method of phase compensation in accordance with claim 2 wherein said step of generating an estimated error signal comprises the step of incrementing, responsive to said first value exceeding said first positive threshold value, a second value of a second counter, an output signal of said second counter being said estimated error signal.

5. A method of phase compensation in accordance with claim 5 wherein said step of generating an estimated error signal comprises the step of decrementing, responsive to said first value exceeding said first negative threshold value, a second value of a second counter, an output signal of said second counter being said estimated error signal.

6. A method of phase compensation in accordance with claim 1 wherein said step of forming an estimated error signal comprises the steps of:
   incrementing, responsive to a positive sign of said first difference signal, a first value of a first counter;
   decrementing, responsive to a negative sign of said first difference signal, said first value of said first counter;
   comparing said first value to a first positive threshold value and a first negative threshold value; and
   generating, responsive to said step of comparing, an estimated error signal.

7. A method of phase compensation in accordance with claim 6 wherein said step of generating an estimated error signal comprises the steps of:
   decrementing, responsive to said step of comparing revealing said first value exceeds said first negative threshold value, a second value of a second counter;
   incrementing, responsive to said step of comparing revealing said first value exceeds said first positive threshold value, said second value of said second counter; and
   generating said estimated error signal, said estimated error signal having a value equal to said second value of said second counter.

8. A method of phase compensation in accordance with claim 7 wherein said step of generating an estimated error signal further comprises the step of setting, responsive to said first value exceeding a value selected from the group consisting of said first positive threshold value and said first negative threshold value, said first counter to a predetermined value.

9. A method of phase compensating a received signal, the received signal having positive and negative zero-crossings and a phase, the received signal is input into a voltage limiter causing asymmetrical distortion of the positive and negative zero-crossings in the signal, the method comprising the steps of:
   sampling the phase of the received signal at the positive and negative zero-crossings, forming a corresponding positive-crossing and negative-crossing phase value; and modulo 2π averaging the positive and the negative-crossing phase values, substantially eliminating the asymmetrical distortion in a resulting average phase signal.

10. A method of phase compensation in accordance with claim 9 wherein said step of averaging comprises the steps of:

subtracting said negative-crossing phase value from said positive-crossing phase value, forming a first output signal;

dividing said first output signal by 2, forming a second output signal; and adding said negative-crossing phase value to said second output value, forming said average phase signal.

11. A phase compensation apparatus for a received signal, the received signal having positive and negative zero-crossings and a phase, the received signal input into a voltage limiter causing asymmetrical distortion of the positive and negative zero-crossings of the received signal, the apparatus comprising:

means for sampling the phase of the received signal at the positive and negative zero-crossings, forming a corresponding positive-crossing and a negative-crossing phase value;

means for combining said negative-crossing phase value and said positive-crossing phase value, forming a first difference signal having a magnitude and a sign selected from the group consisting of a positive sign and a negative sign;

means for forming an estimated error signal the sign of said first difference signal; and means for combining said estimated error signal with said sampled phase selected from the group consisting of said negative zero-crossings and said positive zero-crossings, substantially eliminating said asymmetrical distortion.

12. A phase compensation apparatus in accordance with claim 11 wherein said means for forming said estimated error signal comprises:

means for incrementing, responsive to said first difference signal having a positive sign, a first value of a first counter;

means for comparing said first value to a first positive threshold value; and means for generating, responsive to said means for comparing, an estimated error signal.

13. A phase compensation apparatus in accordance with claim 11 wherein said means for forming an estimated error signal comprises:

means for decrementing, responsive to said first difference signal having a negative sign, a first value of a first counter;

means for comparing said first value to a first negative threshold value; and means for generating, responsive to said means for comparing, an estimated error signal.

14. A phase compensation apparatus in accordance with claim 12 wherein said means for generating said estimated error signal comprises means for incrementing, responsive to said first value exceeding said first positive threshold value, a second value of a second counter, an output signal of said second counter being said estimated error signal.

15. A phase compensation apparatus in accordance with claim 13 wherein said means for generating an estimated error signal comprises means for decrementing, responsive to said first value exceeding said first negative threshold value, a second value of a second counter, an output signal of said second counter being said estimated error signal.

16. A phase compensation apparatus in accordance with claim 11 wherein said means for forming an estimated error signal comprises:

means for incrementing, responsive to said first difference signal having a positive sign, a first value of a first counter;

means for decrementing, responsive to said first difference signal having a negative sign, said first value of said first counter;

means for comparing said first value to a first positive threshold value and a first negative threshold value; and means for generating, responsive to said means for comparing, an estimated error signal.

17. A phase compensation apparatus in accordance with claim 16 wherein said means for generating an estimated error signal comprises:

means for decrementing, responsive to said first value exceeds said first negative threshold value, a second value of a second counter;

means for incrementing, responsive to said first value exceeds said first positive threshold value, said second value of said second counter; and means for generating said estimated error signal, said estimated error signal having a value equal to said second value of said second counter.

18. A phase compensation apparatus in accordance with claim 17 wherein said means for generating an estimated error signal further comprises means for setting, responsive to said first value exceeding a value selected from the group consisting of said first positive threshold value and said first negative threshold value, said first counter to a predetermined value.

19. A phase compensation apparatus for a received signal, the received signal having positive and negative zero-crossings and a phase, the received signal is input into a voltage limiter causing asymmetrical distortion of the positive and negative zero-crossings in the received signal, the apparatus comprising:

means for sampling the phase of the received signal at the positive-crossings and negative zero-crossings, forming a corresponding positive and negative-crossing phase value; and means for modulo 2π averaging the positive and the negative-crossing phase value, substantially eliminating the asymmetrical distortion in a resulting average phase signal.

20. A phase compensation apparatus in accordance with claim 19 wherein said means for averaging comprises:

means for subtracting said negative-crossing phase value from said positive-crossing phase value, forming a first output signal;

means for dividing said first output signal by 2, forming a second output signal; and means for adding said negative-crossing phase value to said second output value, forming said average phase signal.

21. A radiotelephone including a voltage limiter, a phase digitizer, a phase compensation circuit, and receiving radio frequency (RF) signals, the radiotelephone comprising:

means for voltage limiting the RF signals, outputting a first limited signal having asymmetrical phase errors;

means for sampling said first limited signal within the phase digitizer at the positive and negative zero-crossings of said first limited signal, forming a corresponding positive-crossing and a negative-crossing phase value;

means for combining said negative-crossing phase value and said positive-crossing phase value, forming a first difference signal having a magnitude and a sign selected from the group consisting of a positive sign and a negative sign;

means for forming an estimated error signal responsive to the sign of said first difference signal; and means for combining said estimated error signal with said sampled phase selected from the group consisting of said negative zero-crossings and said positive zero-crossings, substantially eliminating said asymmetrical distortion.

22. A radiotelephone in accordance with claim 21 wherein said means for forming an estimated error signal comprises:

means for incrementing, responsive to said first difference signal having a positive sign, a first value of a first counter;

means for decrementing, responsive to said first difference signal having a negative sign, said first value of said first counter;

means for comparing said first value to a first positive threshold value and a first negative threshold value; and means for generating, responsive to said means for comparing, an estimated error signal.

23. A radiotelephone in accordance with claim 22 wherein said means for generating an estimated error signal comprises:

means for decrementing, responsive to said first value exceeding said first negative threshold value, a second value of a second counter;

means for incrementing, responsive to said first value exceeding said first positive threshold value, said second value of said second counter; and means for generating said estimated error signal, said estimated error signal having a value equal to said second value of said second counter.

24. A radiotelephone in accordance with claim 23 wherein said means for generating said estimated error signal further comprises means for setting, responsive to said first value exceeding a value selected from the group consisting of said first positive threshold value and said first negative threshold value, said first counter to a predetermined value.

25. A radiotelephone including a voltage limiter, a phase digitizer, a phase compensation circuit, and receiving radio frequency (RF) signals, the radiotelephone comprising:

means for voltage limiting the RF signals, outputting a first limited signal having asymmetrical phase errors;

means for sampling the phase of the received signal within the phase digitizer at the positive and negative zero-crossings, forming a corresponding positive-crossing and negative-crossing phase value; and means for modulo 2π averaging the positive-crossing and the negative-crossing phase values, substantially eliminating the asymmetrical distortion in a resulting average phase signal.

26. A radiotelephone in accordance with claim 25 wherein said means for averaging comprises:

means for subtracting said negative-crossing phase value from said positive-crossing phase value, forming a first output signal;

means for dividing said first output signal by 2, forming a second output signal; and means for adding said negative-crossing phase value to said second output value, forming said average phase signal.

27. A method of phase compensation of a received signal, the received signal having positive and negative zero-crossings and a phase, the received signal input into a voltage limiter causing asymmetrical distortion of the positive and negative zero-crossings of the received signal, the method comprising the steps of:

sampling the phase of the received signal at the positive and negative zero-crossings, forming a corresponding positive-crossing and a negative-crossing phase value;

combining said negative-crossing phase values and said positive-crossing phase value, forming a first difference signal having a magnitude and a sign selected from the group consisting of a positive sign and a negative sign;

forming an estimated error signal responsive to said first difference signal comprising the steps of:
incrementing, responsive to a positive sign of said first difference signal, a first value of a first counter,
comparing said first value to a first positive threshold value, and
generating, responsive to said step of comparing, an estimated error signal; and combining said estimated error signal with said sampled phase selected from the group consisting of said negative zero-crossings and said positive zero-crossings, substantially eliminating said asymmetrical distortion.

28. A method of phase compensation in accordance with claim 27 wherein said step of generating an estimated error signal further comprises the step of incrementing, responsive to said first value exceeding said first positive threshold value, a second value of a second counter, an output signal of said second counter being said estimated error signal.

29. A method of phase compensation of a received signal, the received signal having positive and negative zero-crossings and a phase, the received signal input into a voltage limiter causing asymmetrical distortion of the positive and negative zero-crossings of the received signal, the method comprising the steps of:

sampling the phase of the received signal at the positive and negative zero-crossings, forming a corresponding positive-crossing and a negative-crossing phase value;

combining said negative-crossing phase value and said positive-crossing phase value, forming a first difference signal having a magnitude and a sign selected from the group consisting of a positive sign and a negative sign;

forming an estimated error signal responsive to said first difference signal comprising the steps of:
decrementing, responsive to a negative sign of said first difference signal, a first value of a first counter, comparing said first value to a first negative threshold value, and generating, responsive to said step of comparing, an estimated error signal; and combining said estimated error signal with said sampled phase selected from the group consisting of said negative zero-crossings and said positive zero-crossings, substantially eliminating said asymmetrical distortion.

30. A method of phase compensation in accordance with claim 29 wherein said step of generating an estimated error signal comprises the step of decrementing, responsive to said first value exceeding said first negative threshold value, a second value of a second counter, an output signal of said second counter being said estimated error signal.

31. A method of phase compensation of a received signal, the received signal having positive and negative zero-crossings and a phase, the received signal input into a voltage limiter causing asymmetrical distortion of the positive and negative zero-crossings of the received signal, the method comprising the steps of:

sampling the phase of the received signal at the positive and negative zero-crossings, forming a corresponding positive-crossing and a negative-crossing phase value;

combining said negative-crossing phase value and said positive-crossing phase value, forming a first difference signal having a magnitude and a sign selected from the group consisting of a positive sign and a negative sign;

forming an estimated error signal responsive to said first difference signal comprising the steps of:

incrementing, responsive to a positive sign of said first difference signal, a first value of a first counter, decrementing, responsive to a negative sign of said first difference signal, said first value of said first counter, comparing said first value to a first positive threshold value and a first negative threshold value, and generating, responsive to said step of comparing, an estimated error signal; and combining said estimated error signal with said sampled phase selected from the group consisting of said negative zero-crossings and said positive zero-crossings, substantially eliminating said asymmetrical distortion.

32. A method of phase compensation in accordance with claim 31 wherein said step of generating an estimated error signal comprises the steps of:

decrementing, responsive to said step of comparing revealing said first value exceeds said first negative threshold value, a second value of a second counter;

incrementing, responsive to said step of comparing revealing said first value exceeds said first positive threshold value, said second value of said second counter; and generating said estimated error signal, said estimated error signal having a value equal to said second value of said second counter.

33. A method of phase compensation in accordance with claim 32 wherein said step of generating an estimated error signal further comprises the step of setting, responsive to said first value exceeding a value selected from the group consisting of said first positive threshold value and said first negative threshold value, said first counter to a predetermined value.

34. A method of phase compensating a received signal, the received signal having positive and negative zero-crossings and a phase, the received signal is input into a voltage limiter causing asymmetrical distortion of the positive and negative zero-crossings in the received signal, the method comprising the steps of:

sampling the phase of the received signal at the positive and negative zero-crossings, forming a corresponding positive-crossing and negative-crossing phase value; and averaging the positive and the negative-crossing phase values, substantially eliminating the asymmetrical distortion in a resulting average phase signal wherein said step of averaging comprises the steps of:

subtracting said negative-crossing phase value from said positive-crossing phase value, forming a first output signal, dividing said first output signal by 2, forming a second output signal, and adding said negative-crossing phase value to said second output value, forming said average phase signal.

35. A phase compensation apparatus for a received signal, the received signal having positive and negative zero-crossings and a phase, the received signal is input into a voltage limiter causing asymmetrical distortion of the positive and negative zero-crossings in the received signal, the apparatus comprising:

means for sampling the phase of the received signal at the positive-crossings and negative zero-crossings, forming a corresponding positive and negative-crossing phase value; and means for averaging the positive and the negative-crossing phase value, substantially eliminating the asymmetrical distortion in a resulting average phase signal, wherein said means for averaging comprises:

means for subtracting said negative-crossing phase value from said positive-crossing phase value, forming a first output signal, means for dividing said first output signal by 2, forming a second output signal, and means for adding said negative-crossing phase value to said second output value, forming said average phase signal.

36. A radiotelephone including a voltage limiter, a phase digitizer, a phase compensation circuit, and receiving a first signal, the radiotelephone comprising:

means for voltage limiting the first signal, outputting a first limited signal having asymmetrical phase errors;

means for sampling said first limited signal within the phase digitizer at the positive and negative zero-crossings of said first limited signal, forming a corresponding positive-crossing and a negative-crossing phase value;

means for combining said negative-crossing phase value and said positive-crossing phase value, forming a first difference signal having a magnitude and a sign selected from the group consisting of a positive sign and a negative sign;

means for forming an estimated error signal responsive to said first difference signal comprises:

means for incrementing, responsive to said first difference signal having a positive sign, a first value of a first counter, means for decrementing, responsive to said first difference signal having a negative sign, said first value of said first counter, means for comparing said first value to a first positive threshold value and a first negative threshold value, and means for generating, responsive to said means for comparing, an estimated error signal; and means for combining said estimated error signal with said sampled phase selected from the group consisting of said negative zero-crossings and said positive zero-crossings, substantially eliminating said asymmetrical distortion.

37. A radiotelephone in accordance with claim 36 wherein said means for generating an estimated error signal comprises:

means for decrementing, responsive to said first value exceeding said first negative threshold value, a second value of a second counter;

means for incrementing, responsive to said first value exceeding said first positive threshold value, said second value of said second counter; and means for generating said estimated error signal, said estimated error signal having a value equal to said second value of said second counter.

38. A radiotelephone including a voltage limiter, a phase digitizer, a phase compensation circuit, and receiving a first signal, the radiotelephone comprising:

means for voltage limiting the first signal, outputting a first limited signal having asymmetrical phase errors;

means for sampling the phase of the received signal within the phase digitizer at the positive and negative zero-crossings, forming a corresponding positive-crossing and negative-crossing phase value; and means for averaging the positive-crossing and the negative-crossing phase values, substantially eliminating the asymmetrical distortion in a resulting average phase signal, wherein said means for averaging comprises:

means for subtracting said negative-crossing phase value from said positive-crossing phase value, forming a first output signal, means for dividing said first output signal by 2, forming a second output signal, and means for adding said negative-crossing phase value to said second output value, forming said average phase signal.

* * * * *

UNITED STATES PATENT AND TRADEMARK OFFICE
CERTIFICATE OF CORRECTION

PATENT NO. : 5,299,232

DATED : March 29, 1994

INVENTOR(S) : LaRosa et al.

It is certified that error appears in the above-identified patent and that said Letters Patent is hereby corrected as shown below:

Col. 6, line 22, please delete "claim 5" and insert therefor --claim 3--.
Col. 6, line 65, before the word "signal" insert --received--.

Signed and Sealed this

Twenty-third Day of August, 1994

BRUCE LEHMAN

Attest:

Attesting Officer

Commissioner of Patents and Trademarks